Dec. 28, 1965 H. MARTIN 3,226,466

SEMICONDUCTOR DEVICES WITH COOLING PLATES

Filed Feb. 5, 1963

3,226,466
Patented Dec. 28, 1965

3,226,466

SEMICONDUCTOR DEVICES WITH COOLING PLATES

Heinz Martin, Munich, Germany, assignor to Siemens-Schuckertwerke Aktiengesellschaft, Berlin-Siemensstadt, Germany, a corporation of Germany Filed Feb. 5, 1963, Ser. No. 256,438
Claims priority, application Germany, Feb. 10, 1962, S 77,980
8 Claims. (Cl. 174—15)

Figure 1:
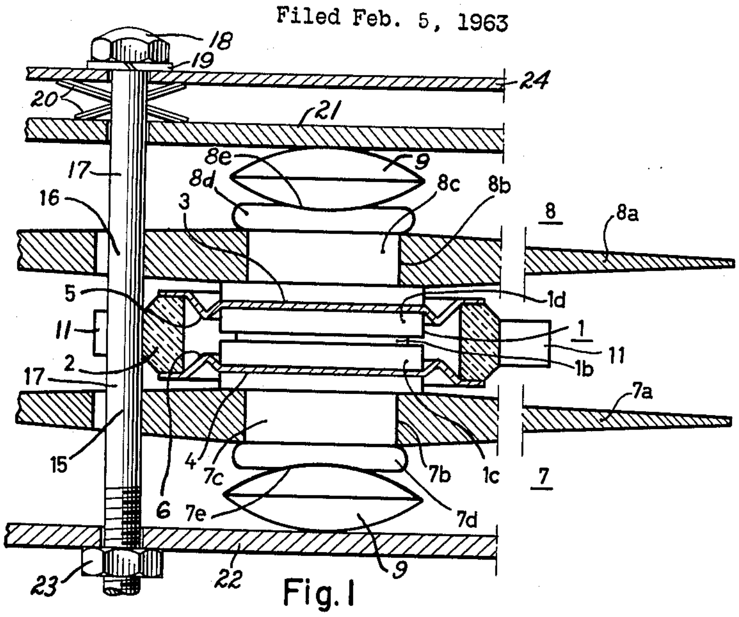

My invention relates to rectifiers and other electronic semiconductor devices of the junction type comprising a monocrystalline body of silicon, germanium or intermetallic semiconductor compound, with electrodes contacted by cooling fins or other metallic plate structures for dissipating the heat resulting from the operation of the semiconductor device.

In a more particular aspect, my invention relates to improvements in semiconductor devices of the type disclosed in my copending application Serial No. 214,076, filed August 1, 1962 and assigned to the assignee of the present invention. These devices comprise a flat-faced crystalline semiconductor member whose electrodes are alloy-bonded with respective reinforcing plates of molybdenum or other metal whose thermal coefficient of expansion is similar to that of the semiconductor material. The composite semiconductor member is enclosed in a casing consisting of an insulating ring and two cover plates of metal peripherally sealed with the insulating ring on axially opposite sides thereof. The two cover plates preferably consist of a ductile material such as silver. The composite semiconductor member is held between the cover plates by mechanical contact pressure only, and thus is capable of thermally expanding or contracting without causing excessive mechanical stresses. However, raised portions of the cover plates hold the member in centered position within the ring. Preferably, the individual semiconductor members are symmetrical with respect to their cover plates, for substantially even heat distribution from the semiconductor body proper to the two end faces. For operation, one or more semiconductor members, thus individually encapsulated, are inserted between two pressure bodies, a mechanical force storer such as a spring being used if necessary. Additional cooling plates may be interposed in contact with the axial end faces of the respective cover plates that form part of the casing for each semiconductor member, thus augmenting the dissipation of Joule's heat from each semiconductor member to the environment.

Relating to devices of this general type, it is an object of my invention to further improve the heat dissipating efficiency and to increase the electric load-carrying capacity of the semiconductor members.

Other objects of the invention are to simplify and improve the manufacture of such devices with respect to the heat-dissipating plate structures for the individually encapsulated semiconductor members.

According to the invention, the cooling plate structures in a semiconductor device of the type described are given greater thickness at the area of heat-conducting contact engagement with the capsule of the adjacent semiconductor member than in those portions of the cooling plate that radially protrude beyond the encapsulated member and are exposed to the surrounding cooling medium such as the ambient air.

Preferably, and in accordance with another feature of the invention, the cross section of the cooling plates tapers from the area of contact engagement toward the protruding ends so as to substantially correspond to the heat flow which, coming from the semiconductor member, passes into the protruding portions of the cooling plate and is progressively dissipated from these plate portions to the ambient medium. For instance, the cooling plates may have a trapezoidal cross section, or a curved cross-sectional configuration tapering away from the middle portion.

While the principle of thus giving the cooling plates a cross section whose thickness is a maximum where the heat flow enters from the semiconductor member but decreases in the direction toward the freely projecting ends, provides for best suitable heat transfer and most economical means of heat dissipation, such a tapering plate structure has also the advantage that it can be produced in a simple manner by using a rolled-metal section as starting material. The individual cooling plates can simply be cut from such a material. The cross section of the rolled stock material has a relatively thick center portion, for instance, of rectangular shape, and two integral lateral portions of trapezoidal shape, the respective shorter base lines of the trapezoids being located at the lateral ends.

After a cooling plate of this type has been severed from a bar or rod of starting material, it is necessary, as a rule, to machine those surface areas where the plate is to engage the casing of the semiconductor member and the clamping means that are to hold the cooling plates and members pressed together. However, according to another feature of the invention, the required machining is minimized by interposing an auxiliary body between the semi conductor capsule and the cooling plate, and to firmly join the added body with the cooling plate so as to form part of the cooling structure. Preferably, the additional body is inserted in a bore of the cooling plate and engages the peripheral surface of the bore as tightly as possible while a shoulder of the body is pressed against the planar surface of the cooling plate. Such a double engagement can be obtained in a relatively simple manner by using a generally mushroom-shaped body and pressing the thinner portion thereof into the bore of the cooling plate until the wider top portion of the body abuts against the surface on the cooling plate.

It is frequently customary to machine surfaces for thermal and electrical conductance contacts by subjecting them to deforming pressure with the aid of a pressure punch having the desired planar or curved configuration at its active surface. This principle of pressure shaping may be used to advantage namely for inserting the auxiliary body (*8c*, *8d*) into the cooling plate by a pressing operation which at the same time serves to impart an exactly predetermined shape to the end faces of the inserted body and to clamp this inserted body in the bore of the cooling plate and against the top and bottom surfaces thereof.

Figure 2:
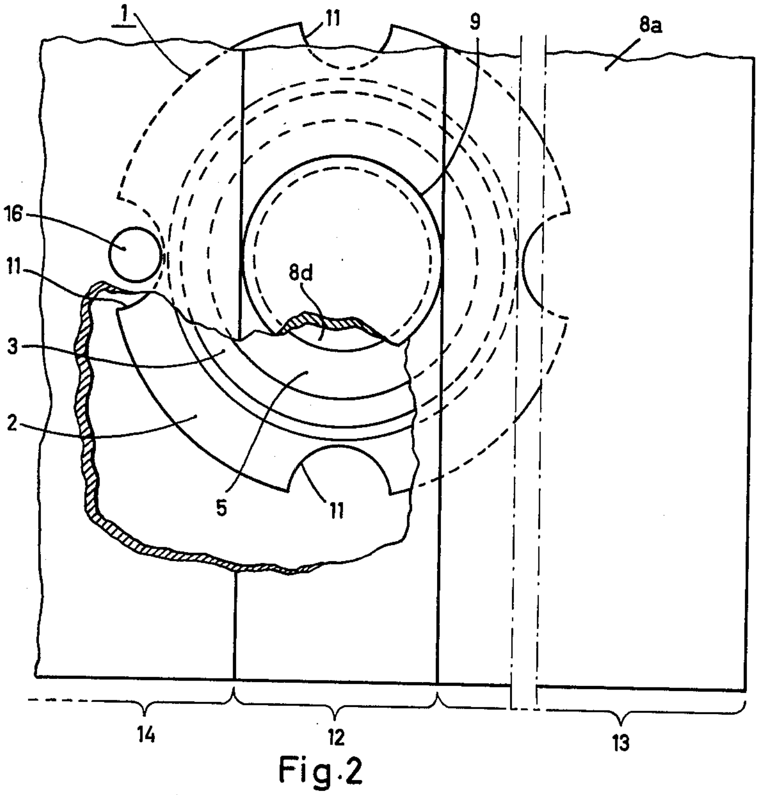

The above-mentioned and other objects, advantages and features of my invention, said features being set forth with particularly in the claims annexed hereto, will be apparent from, and will be described in, the following with reference to an embodiment of a semiconductor device according to the invention illustrated by way of example on the accompanying drawing in which FIG. 1 is a sectional front view and FIG. 2 a plan view of an encapsuled rectifier.

In the illustrated embodiment a circular semiconductor member 1, such as a silicon p-n junction diode, has a flat crystalline disc 1*b* of silicon provided with two reinforcing plates 1*c* and 1*d*. Respective electrode materials are alloyed into the opposite flat surfaces of the monocrystalline silicon body. The electrode materials contain the doping substances necessary to produce the rectifying p-n junction in the crystal. The reinforcing plates 1*c* and 1*d* consist of molybdenum or tantalum whose thermal coefficients of expansion are sufficiently close to that of silicon to prevent occurrence of appreciable mechanical tension due to changes in temperature during operation of the rectifier device. The plates 1c and 1d are preferably joined with the crystalline disc 1b by the same alloying process that is used for joining the electrode coatings with the crystal and thereby doping the silicon in the above-described maner.

The semiconductor member 1 is mounted in a housing formed of an insulating ring 2 and two conductive covers 3 and 4. The ring 2 preferably consists of ceramic material or glass. The covers 3, 4 consist of ductile metal, preferabley sheet silver, and are provided with embossed annular ridges 5 and 6 which surround the semiconductor member and hold it in proper position. The marginal zones of the respective covers 3 and 4 are gas-tightly joined by a solder junction with the insulating ring 2. The mechanical connection and gas-tight seal may also be produced by any other suitable fusion junction. The ring 2 is shown provided with recesses 11 distributed over its outer periphery.

The encapsulated semiconductor member so far described is in accordance with the above-mentioned patent application According to my invention, however, the illustrated device is provided with cooling structures 7 and 8 in intimate face-to-face contact with the outer surfaces of the covers 3 and 4 respectively and comprising each a cooling plate *7a* or *8a* of a bilaterally tapering cross section. Each cooling plate is rectangular and produced by cutting it transversely from profile stock material obtained by a rolling or drawing process. The plates *7a*, *8a* have a cross sectional configuration perpendicular to the longitudinal axis of the profile stock material from which they are cut and consisting of a central portion 12 of rectangular cross section and two side portions 13, 14 of trapezoidal cross section. The cooling plates *7a* and *8a* are each provided with a bore *7b* or *8b*. Each cooling structure further comprises an auxiliary body *7c* or *8c* inserted into one of respective bores *7b* and *8b*.

Initially, the auxiliary bodies *7c* or *8c*, are mushroom-shaped, the respective wider top portions being denoted by *7d*, *8d*. From the top portion there projects a cylindrical shank *7c*, *8c* whose original length is greater than the thickness of the center portion of the plate member. This length is so dimensioned that, by applying impact or pressure upon the inserted body, this body is upset and deformed so as to be firmly clamped in the bore *7b*, *8b* and to form a shoulder forced against the planar surface of the cooling plate. At the same time, a concave surface *7e*, *8e* is obtained on the member *7d*, *8d* by the same impact or pressing action. By virtue of this pressing action the shape of the contact surface of the inserted body is made planar for engagement of cover 3 or 4, whereas the opposite surface at *7e* or *8e* is directly given the counter shape corresponding to a lens-shaped pressure body 9 or 10, without necessitating appreciable subsequent machining of these end faces of the inserted auxiliary body before the cooling structure can be assembled and used together with the other components of the semiconductor device. While a concave surface is shown at *7e*, *8e*, any other shape can be chosen, as may be desired for cooperation with a correspondingly shaped pressure structure of the clamping means.

The above-described method of shaping and attaching the axliliary bodies by deforming pressure secures the desired good mutual engagement between the end face of the inserted body and the adjacent planar surface of the casing of the semiconductor element in order to thus provide for a cross-sectional transfer area adapted to satisfactorily transfer and dissipate heat from the semiconductor member. In the illustrated embodiment this same transfer area simultaneously forms part of the electric current path through the semiconductor device. This also requires a satisfactory mutual contact of the semiconductor casing and the cooling structures because a relatively high electric resistance at this point would generate additional Joule's heat which would have to be additionally dissipated and might cause undesired heat accumulation within the heat transfer path.

As illustrated, the insulating ring 2 may be provided with recesses 11 on its outer periphery. This permits assembling a number of rectifier units in form of a stack within a frame comprising corresponding guide bars or ribs at its inner periphery, as described in the above-mentioned copending application Serial No. 214,076, all of the semiconductor members and other components being pressed together in the frame by common clamping means. It is preferable, for such purposes, to provide the cooling plates *7a*, *8a* with respective bores 15, 16 so that clamping bolts 17 or rods can be passed through bores 15, 16 and recesses 11 for holding all components together and exerting the pressure required for good electrical and thermal contact between each reinforcing plate *1c*, *1d* of the semiconductor members and the adjacent cover 3 or 4, as well as between these covers and the adjacent cooling structure. Thus, as shown in FIG. 1, each bolt 17 is provided with a head 18 which acts against a wall 24 of a mounting structure (not otherwise shown) through a lock nut 19 when the nut 23 is suitably tightened, so that the spring 20 is compressed and pressure plates 21 and 22 consequently exert clamping pressure against the lens-shaped pressure bodies 9.

Preferably the cooling plates *7a*, *8a* and the inserted bodies, such as the body *8c*–*8d*, are made of a material which is a good thermal conductor, for instance copper.

The invention is applicable particularly in conjunction with semiconductor devices on the basis of silicon, germanium, or intermetallic semiconductor compounds.

I claim:

1. A semiconductor device, comprising a semiconductor member having a flat crystalline body of semiconductor material with two reinforcing plates alloy-bonded to the respective faces of said body and consisting of metal whose thermal coefficient of expansion is similar to that of said semiconductor material; a housing having an insulating ring surrounding said semiconductor member and having top and bottom covers of metal peripherally and gas-tightly joined to said ring on axially opposite sides thereof respectively and in face-to-face contact with said respective reinforcing plates; two cooling structures each located on opposite sides of said housing; and means for pressing said cooling structures in heat conductive contact with said respective covers, each of said cooling structures comprising a cooling plate having a middle portion in face-to-face engagement with one of said respective covers and two lateral portions extending away from said middle portion in diametrically opposite relation to said semiconductor member and protruding beyond said semiconductor member for exposure to heat dissipating coolant, each said cooling plate having its largest thickness in said middle portion and having in each of said lateral portions a cross-sectional shape tapering in the direction from said middle portion toward the protruding end.

2. In a semiconductor device according to claim 1, said cooling structures having generally rectangular shape seen in the axial direction of said semiconductor member, and each of said middle and lateral portions seen in the same direction having likewise rectangular shape, with said tapering lateral portions forming a substantially straight edge at the end of the tapering cross section.

3. In a semiconductor device according to claim 1, said cooling structures having respective planar surfaces on said middle portions in contact with said respective metal covers of said semiconductor member.

4. In a semiconductor device according to claim 1, each of said cooling structures comprising an auxiliary insert of metal in heat-conducting connection with said middle portion, said insert having a planar surface in contact with one of said respective metal covers of said semiconductor member.

5. In a semiconductor device according to claim 1, each of said cooling structures having a bore in said middle portion, an insert of metal having a cylindrical portion seated in said bore and permanently pressure-joined therewith, and said insert having a contact portion pressure-seated against one of said respective covers of said semiconductor member so as to form a heat conductive connection between said member and said middle portion of said structure.

6. In a semiconductor device according to claim 5, said insert having a top portion integral with said cylindrical portion and located adjacent to said middle portion of said cooling structure on the side remote from said semiconductor member, said top portion having a larger diameter than said bore and said cylindrical portion.

7. In a semiconductor device according to claim 6, said top portion having a curved contour for area engagement by a pressure body at different angles of pressure force.

8. In a semiconductor device according to claim 6, a lens-shaped pressure body in pressure engagement with the top portion of each said inserts.

References Cited by the Applicant

UNITED STATES PATENTS

| | | | |
|---|---|---|---|
| 2,815,472 | 12/1957 | Jackson et al. | 317—235 |
| 2,899,610 | 8/1959 | Van Amstel | 317—235 |

FOREIGN PATENTS

| | | |
|---|---|---|
| 155,051 | 2/1954 | Australia. |

JOHN F. BURNS, *Primary Examiner.*

JOHN P. WILDMAN, E. JAMES SAX, *Examiners.*